US009406800B2

(12) United States Patent
Lin et al.

(10) Patent No.: US 9,406,800 B2
(45) Date of Patent: Aug. 2, 2016

(54) BODY-TIED, STRAINED-CHANNEL MULTI-GATE DEVICE AND METHODS OF MANUFACTURING SAME

(71) Applicant: Taiwan Semiconductor Manufacturing Company, Ltd., Hsin-Chu (TW)

(72) Inventors: Hong-Nien Lin, Taichung (TW); Horng-Chih Lin, Hsin-Chu (TW); Tiao-Yuan Huang, Cupertino, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/969,914

(22) Filed: Dec. 15, 2015

(65) Prior Publication Data

US 2016/0104800 A1     Apr. 14, 2016

Related U.S. Application Data

(63) Continuation of application No. 14/607,977, filed on Jan. 28, 2015, now Pat. No. 9,214,554, which is a continuation of application No. 11/483,906, filed on Jul. 10, 2006, now Pat. No. 8,946,811.

(51) Int. Cl.
*H01L 21/336* (2006.01)
*H01L 29/78* (2006.01)
*H01L 21/8238* (2006.01)
(Continued)

(52) U.S. Cl.
CPC .... *H01L 29/7849* (2013.01); *H01L 21/823807* (2013.01); *H01L 21/823821* (2013.01); *H01L 29/161* (2013.01); *H01L 29/165* (2013.01);
(Continued)

(58) Field of Classification Search
CPC ................ H01L 29/1054; H01L 29/66795; H01L 29/7849
USPC ........................................... 438/304
See application file for complete search history.

(56) References Cited

U.S. PATENT DOCUMENTS 6,413,802 B1   7/2002   Hu et al.
6,475,869 B1   11/2002  Yu
(Continued)

FOREIGN PATENT DOCUMENTS

CN          1630094          6/2005

OTHER PUBLICATIONS

Jeong Kim, et al, Surface and Interface Structures of Epitaxial Silicon Nitride on Si (111), Jan. 2003, The American Physical Society, Physical review, pp. 035304-1 to 035304-3.*
(Continued)

*Primary Examiner* — David S Blum
(74) *Attorney, Agent, or Firm* — Slater Matsil, LLP

(57) ABSTRACT

A fin-FET or other multi-gate transistor is disclosed. The transistor comprises a semiconductor substrate having a first lattice constant, and a semiconductor fin extending from the semiconductor substrate. The fin has a second lattice constant, different from the first lattice constant, and a top surface and two opposed side surfaces. The transistor also includes a gate dielectric covering at least a portion of the top surface and the two opposed side surfaces, and a gate electrode covering at least a portion of the gate dielectric. The resulting channel has a strain induced therein by the lattice mismatch between the fin and the substrate. This strain can be tuned by selection of the respective materials.

20 Claims, 14 Drawing Sheets

(51) Int. Cl.
 *H01L 29/16* (2006.01)
 *H01L 29/161* (2006.01)
 *H01L 29/165* (2006.01)
 *H01L 29/66* (2006.01)

(52) U.S. Cl.
 CPC ...... *H01L 29/1608* (2013.01); *H01L 29/66795* (2013.01)

(56) References Cited

U.S. PATENT DOCUMENTS

| | | | |
|---|---|---|---|
| 6,706,571 | B1 | 3/2004 | Yu et al. |
| 6,858,478 | B2 | 2/2005 | Chau et al. |
| 7,190,050 | B2 | 3/2007 | King et al. |
| 7,247,887 | B2 | 7/2007 | King et al. |
| 7,265,008 | B2 | 9/2007 | King et al. |
| 7,508,031 | B2 | 3/2009 | Liu et al. |
| 7,528,465 | B2 | 5/2009 | King et al. |
| 7,605,449 | B2 | 10/2009 | Liu et al. |
| 2003/0034529 | A1 | 2/2003 | Fitzgerald et al. |
| 2003/0178681 | A1 | 9/2003 | Clark et al. |
| 2005/0017240 | A1 | 1/2005 | Fazan |
| 2005/0153490 | A1 | 7/2005 | Yoon et al. |
| 2005/0158934 | A1 | 7/2005 | Yun et al. |
| 2005/0224875 | A1 | 10/2005 | Anderson et al. |
| 2007/0090416 | A1 | 4/2007 | Doyle et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2008/0265280 | A1 | 10/2008 | Currie |
| 2008/0290470 | A1 | 11/2008 | King et al. |
| 2008/0296632 | A1 | 12/2008 | Moroz et al. |
| 2009/0181477 | A1 | 7/2009 | King et al. |

OTHER PUBLICATIONS

Hisamoto, Digh et al., "FinFET—A Self-Aligned Double-Gate MOSFET Scalable to 20 nm," IEEE Transactions on Electron Devices, vol. 47, Issue 12, Dec. 2000, pp. 2320-2325.

Hisamoto, Digh et al., "A Fully Depleted Lean-channel Transistor (DELTA)—A novel vertical ultra thin SOI MOSFET," IEDM, 1989, pp. 833-836.

Park, T. et al., "Fabrication of Body-Tied FinFETs (Omega MOSFETs) Using Bulk Si Wafers," 2003 Symposium on VLSI Technology Digest of Technical Papers, 2 pages.

* cited by examiner

BODY-TIED, STRAINED-CHANNEL MULTI-GATE DEVICE AND METHODS OF MANUFACTURING SAME

PRIORITY CLAIM

The present application is a continuation application of U.S. patent application Ser. No. 14/607,977, filed Jan. 28, 2015, now U.S. Pat. No. 9,214,554, and entitled "Body-Tied, Strained-Channel Multi-Gate Device and Methods of Manufacturing Same," which application claims priority to and is a continuation application of U.S. patent application Ser. No. 11/483,906, filed Jul. 10, 2006, now U.S. Pat. No. 8,946,811 issued on Feb. 3, 2015, and entitled "Body-Tied, Strained-Channel Multi-Gate Device and Methods of Manufacturing Same," which applications are incorporated herein by reference.

TECHNICAL FIELD

The present invention relates generally to multi-gate transistor structures and more specifically to a multi-gate transistor having a strained channel region.

BACKGROUND

Multi-gate structures are known in the art and are increasingly employed because of the advantageous features of scalability, drive current improvement, and switching speed, among others. Double gate transistors, triple gate transistors, omega transistors, and fin-FET transistors are among the multi-gate structures that have been proposed and that are finding increased acceptance.

Typically, multi-gate structures are formed on a so-called silicon on insulator (SOI) substrate. This is because multi-gate transistors are generally formed on mesa or island structures. These mesas or islands are preferably highly electrically isolated to prevent noise and cross talk, and the SOI substrate readily lends itself to this process.

Recently, a so-called body-tied multi-gate structure has been proposed by Park et al., *Fabrication of Body-Tied Fin-FETs (Omega MOSFETs) Using Bulk Si Wafers,* 2003 Symposium on VLSI Technology Digest of Technical Papers, which article is incorporated herein by reference. Park et al. describe a multi-gate structure that is formed on a bulk silicon wafer. Advantageously, bulk wafer processing provides cost savings over the more expensive SOI wafers. Additionally, tying the transistor body to the bulk substrate also provides improved thermal dissipation and improved grounding and, hence, improved noise reduction.

While the prior art devices show improvement over planar transistors, further improvement in device performance is still needed. One such improvement is described herein.

SUMMARY OF THE INVENTION

In one aspect, the present invention provides for a fin-FET transistor. The transistor comprises a semiconductor substrate having a first lattice constant, and a semiconductor fin extending from the semiconductor substrate. The fin has a second lattice constant, different from the first lattice constant, and a top surface and two opposed side surfaces. The transistor also includes a gate dielectric covering at least a portion of said top surface and said two opposed side surfaces, and a gate electrode covering at least a portion of said gate dielectric.

In another aspect, the present invention provides for an integrated circuit. The integrated circuit includes a semiconductor substrate having a top surface with a first lattice constant, and an insulating film on said top surface of said semiconductor substrate. A plurality of islands extends from said top surface of the semiconductor substrate. The islands have a second lattice constant that is different from the first lattice constant, the islands further extend above a top surface of the insulating film. The integrated circuit also includes at least multi-gate FET device. The multi-gate device includes a gate dielectric overlying a portion of at least one of the plurality of islands, and gate electrode overlying the gate dielectric.

In yet another aspect, the present invention provides for a method of manufacturing a transistor. The method provides a substrate having a top surface, the top surface having a first lattice constant, and forming an insulating layer over the top surface. The method further provides forming an opening in the insulating layer to expose a portion of the top surface, and epitaxially growing an extension on the top surface in the opening. The extension has a second lattice constant that is different from the first lattice constant. The method further provides forming a doped region in the extension, forming a gate dielectric over at least a portion of extension, and forming a gate electrode over the gate dielectric.

An advantageous feature of the invention is the ability to tune the strain in the channel of the multi-gate transistor, by stress arising from the interface between the underlying substrate and islands extending therefrom.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. In fact, certain features of the illustrations are exaggerated in relative size in order to more clearly illustrate those and other features. To more clearly illustrate certain embodiments, a letter indicating variations of the same structure, material, or process step may follow a reference number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
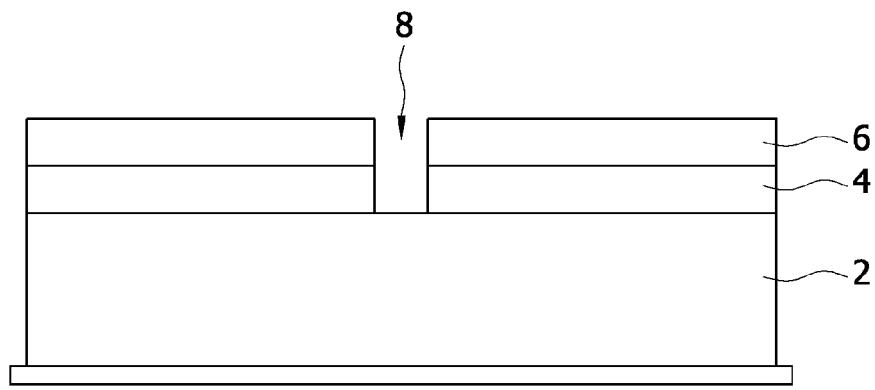
FIGS. 1a through 1e illustrate steps in the manufacture of a first illustrative embodiment multi-channel transistor of the present invention.

FIG. 1a illustrates an intermediate structure in the manufacture of a first illustrative embodiment body-tied, strained-fin device. While the illustrative embodiments illustrate fin-FET devices, one skilled in the art will recognize that the present invention is applicable to other multi-gate transistors as well. At the step in the process illustrated in FIG. 1a, a substrate 2 is provided upon which an oxide layer 4 and a nitride layer 6 over oxide layer 4 have been formed. In the illustrative embodiment, substrate 2 is a conventional p-type bulk silicon wafer.

Oxide layer 4 is preferably formed by chemical vapor deposition (CVD), thermal oxidation, or other conventional oxide deposition techniques. Oxide layer 4 is preferably at least 50 Å thick and more preferably between about 100 Å and about 300 Å in thickness.

Nitride layer 6 may be formed by conventional deposition techniques, such as CVD, plasma enhanced chemical vapor deposition (PECVD), and the like. In the illustrative embodiment, it is desirable that the combined thickness of oxide 4 and nitride 6 ranges between about 500 Å and about 1,000 Å, depending upon the desired height of the subsequently formed fin, as will be discussed below. In the illustrative embodiments in which oxide 4 ranges from about 100 to 300 Å, nitride 6 will range from about 200 to 400 Å (for a 500 Å fin) and from about 700 to 900 Å (for a 1,000 Å fin).

As shown in FIG. 1a, nitride 6 and oxide 4 have been patterned, using a photoresist layer (not shown) and conventional photolithography processes. Nitride 6 is anisotropically etched, using e.g., conventional dry etching techniques, followed by an anisotropic etch of oxide 6, using e.g., plasma etch. The patterning and etching of oxide 4 and nitride 6 form a trench 8 and expose the top surface of underlying substrate 2. For clarity, only one trench is shown in oxide 4 and nitride 6. One skilled in the art will recognize that a plurality (in fact, millions) of such trenches will be formed in a typical integrated circuit on a typical wafer.

Figure 1B:
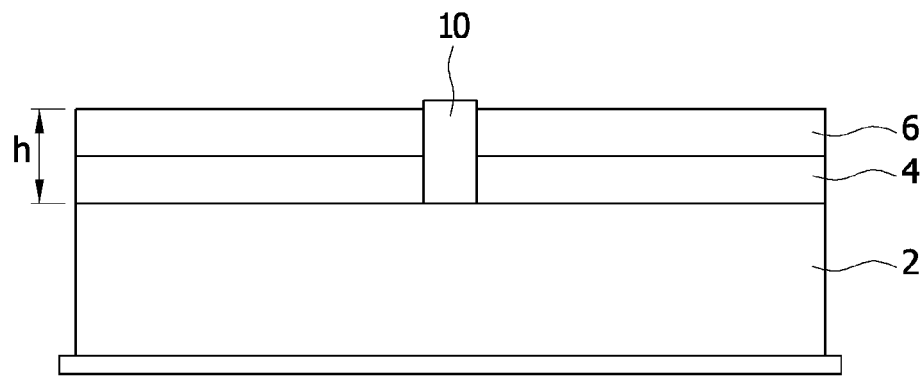

Silicon germanium (SiGe) is next epitaxially grown on the exposed surface of substrate 2, filling trench 8, as shown in FIG. 1b. This epitaxially grown SiGe will form a fin 10 of the resulting fin-FET transistor, as will be explained in greater detail below. The various methods and processes for epitaxially growing SiGe fin 10 will be evident to one skilled in the art and are matters of design choice. For example, a typical SiGe alloy could be formed by a decomposition of approximately 20 sccm of dichlorosilane ($SiH_2Cl_2$) approximately 50-150 sccm of one percent hydrogen diluted germane ($GeH_4$) at a temperature of between 550° C.-750° C. and a pressure of approximately 10-200 torrs. Fin 10 is preferably grown to a height of from about 500 Å to about 1,000 Å. This is the reason why the combined thickness of oxide 4 and nitride 6 is preferably about 500 Å to about 1,000 Å. In the figure, fin 10 is grown to be substantially coplanar with the top surface of nitride 6. In other embodiments, fin 10 may grow slightly above the top surface of nitride 6, although care must be taken that epitaxial growth does not spread out laterally over the top surface of nitride 6. In yet other embodiments, epitaxial growth of fin 10 ceases prior to fin 10 reaching the top of trench 8. These are design choices that can be established with routine experimentation.

A crystal lattice mismatch occurs at the interface between SiGe fin 10 and substrate 2. This lattice mismatch causes stress and applies a strain on fin 10. The lattice mismatch also causes strain in substrate 2, but that strain is not significant for the purposes of the illustrative embodiments of the present invention. As is known in the art, stress improves charge carrier mobility in a crystalline semiconductor device. More particularly, the lattice mismatch between substrate 2 and SiGe fin 10 results in bi-axial compressive strain in SiGe fin 10. Compressive strain improves hole mobility in p-type devices. This ability to engineer strain in the thin fin provides a significant advantageous feature over the prior art.

Figure 1C:
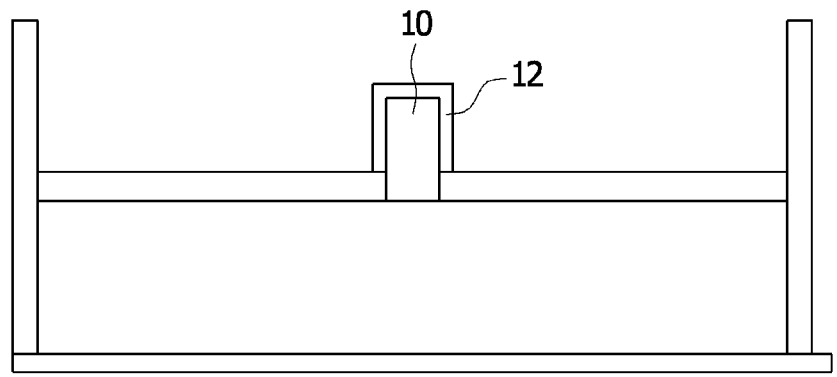

Continuing to FIG. 1c, nitride layer 6 is removed, such as by a wet or dry etch. The particular etch chemistry and process is a matter of design choice. The main constraint on the etch process is that it has high selectivity to silicon nitride, relative to underlying silicon oxide layer 4. It is desirable that silicon oxide layer 4 not be significantly attacked during the removal of silicon nitride layer 6. The removal of nitride layer 6 could be done, for instance, by using the phosphate ($H_3PO_4$) at a temperature of approximately 80-120° C. (a "wet etch" process). Removing nitride layer 6 exposes the top surface and portions of the sidewalls of fin 10. At this stage, appropriate impurities can be implanted into fin 10. For instance, fin 10 can be doped with either p-type or n-type impurities to establish a desired nominal impurity concentration. Alternatively, fin 10 can be doped in situ by introducing appropriate impurities at the desired concentration during the epitaxial growth process. Source and drain regions can then be implanted, as is known in the art.

As shown in FIG. 1c, a silicon cap layer, or sacrificial layer, 12 is formed on the exposed surfaces of fin 10. This sacrificial layer is preferably epitaxially grown. Because the silicon will epitaxially grow on the exposed SiGe regions, but not on the exposed surface of oxide layer 4, the epitaxial growth of polysilicon cap layer 12 is self-aligned. In the illustrative embodiments, in which a gate oxide of ten to twenty angstroms is desired, sacrificial cap layer 12 is grown to about five to ten angstroms.

Figure 1D:
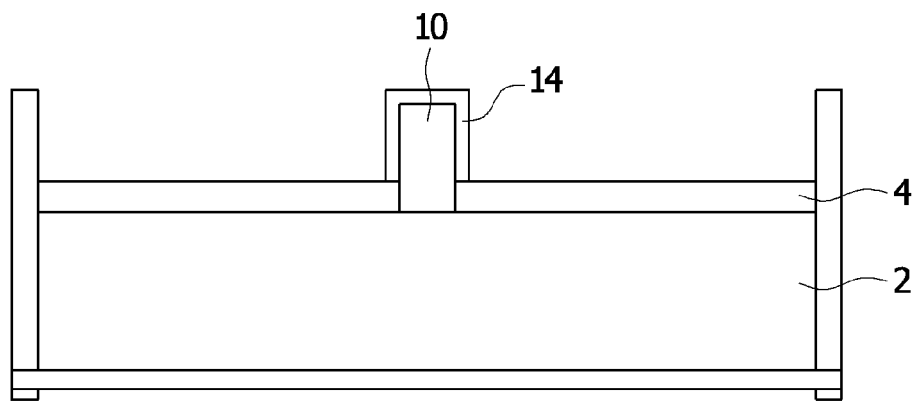

As illustrated in FIG. 1d, cap layer 12 is converted to silicon oxide layer 14 by exposing cap layer 12 to an oxidizing environment, such as a steam environment. Silicon cap layer 12 combines with oxygen to form silicon oxide layer 14 (layer 14 will sometimes be referred to as a gate dielectric layer 14), which will serve as the gate dielectric for a subsequently formed fin-FET transistor. An advantageous feature of cap layer 12 is that it prevents SiGe fin 10 from oxidizing. Oxidation of SiGe fin 10 would cause a re-distribution of the germanium atoms within fin 10, which is undesirable. It is also undesirable to have Ge impurities in the gate dielectric.

Figure 1E:
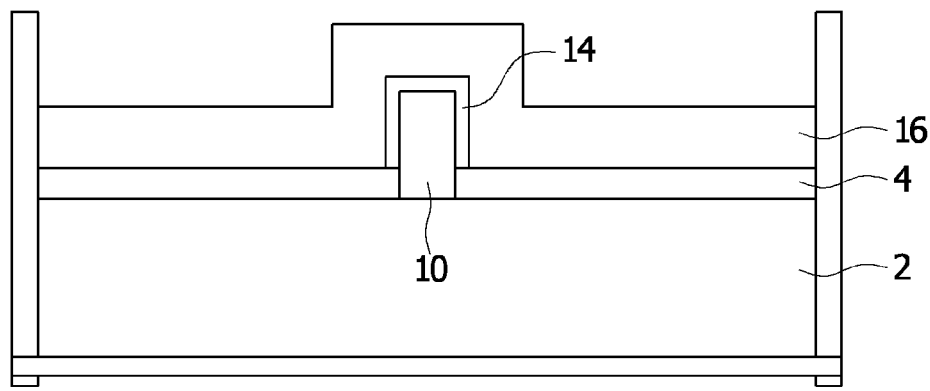

Finally, as shown in FIG. 1e, a gate electrode 16 is formed over gate dielectric layer 14 and surrounding oxide layer 4. In the illustrative embodiment, gate electrode 16 comprises polysilicon. Gate electrode 16 can be deposited and doped in situ or can be deposited undoped and subsequently doped via ion implantation or other known techniques.

In an alternative embodiment, gate dielectric 14 can be formed of a high dielectric constant (high k) material rather than $SiO_2$. Materials such as $HfO_2$, HfSiO can be employed, as can metal oxides and/or metal silicates of e.g., hafnium, aluminum, zirconium, lanthalum, and the like.

Likewise, in an alternative embodiment, and particularly when a high-k dielectric material is used, gate electrode 16 could be formed of metal, in lieu of polysilicon. One exemplary metal material is TaC, although other materials, including metals (Ta, Ti, Ru, Mo, etc.), metal alloys, metal nitrides (TaN, TiN, Mo$_2$N, etc.), metal carbides (TaC, etc.), and conducting metal oxides (RuO$_2$, etc.) and the like, could also be employed for the gate electrode.

Figure 2A:
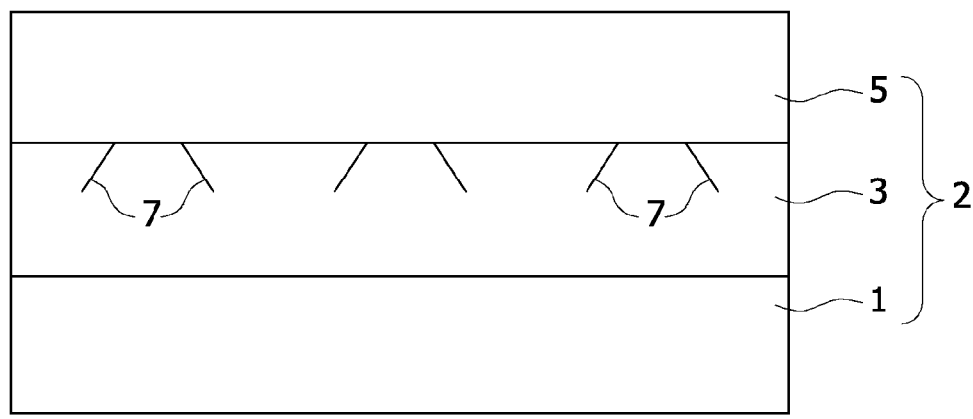
FIGS. 2a through 2f illustrate steps in the manufacture of a second illustrative embodiment multi-channel transistor of the present invention.

FIGS. 2a through 2f illustrate another exemplary embodiment. In this embodiment, as shown in FIG. 2a, substrate 2 comprises three sub-components. The first component is a silicon wafer 1a, typically a conventional p-type bulk silicon wafer. Buffer layer 3 is formed atop silicon wafer 1. A relaxed SiGe layer 5, having perhaps ten to thirty percent concentration of Ge, is formed atop buffer layer 3. Buffer layer 3, as the name implies, serves as to buffer, or ameliorate, the effects of lattice mismatch between silicon wafer 1 and relaxed SiGe layer 5. Buffer layer 3 accomplishes this by having a germanium concentration of essentially nil at the interface with silicon wafer 1—meaning essentially no lattice mismatch between layers 1 and 3, and a germanium concentration that essentially matches the germanium concentration of relaxed SiGe layer 5—meaning essentially no lattice mismatch between layers 3 and 5. The germanium concentration gradually increases as one proceeds from the bottom of buffer layer 3 (near the silicon wafer 1 interface) to the top of buffer layer 3 (near the relaxed SiGe layer interface). By virtue of this gradient in concentration, the effects of the lattice mismatch are virtually eliminated, or at least substantially reduced. In this way, SiGe layer 5 is not affected by the lattice mismatch with silicon wafer 1.

In the illustrative embodiments, buffer layer 3 is thick enough so that dislocations 7 arising at the buffer 3/SiGe layer 5 interface do not propagate completely through the layer. In the illustrative embodiments, buffer layer 3 has a thickness ranging from about 5,000 Å to about 10,000 Å. Relaxed SiGe layer 5 preferably has a thickness ranging from about 2,000 Å to about 3,000 Å. The resulting structure, as illustrated in FIG. 2a, provides a "virtual" SiGe substrate upon which devices can be fabricated.

Figure 2B:
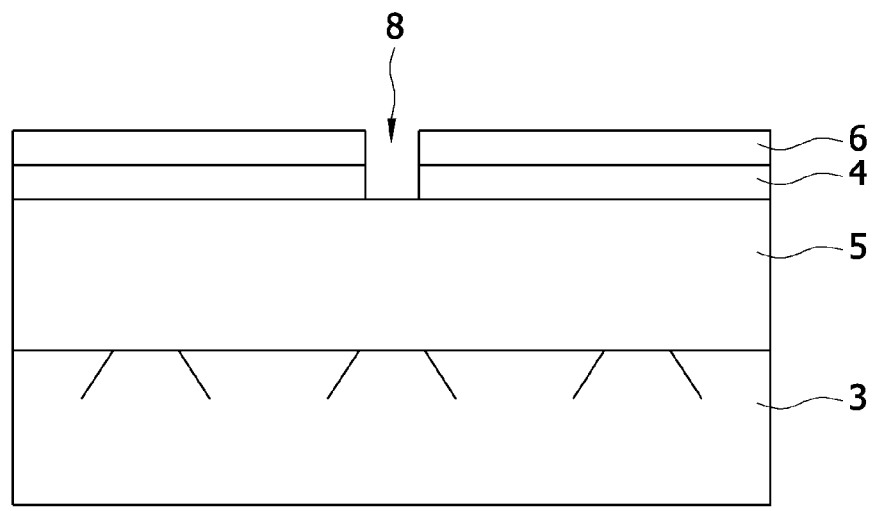

As shown in FIG. 2b, processing continues in a manner similar to that illustrated in FIG. 1a. Oxide layer 4 and nitride layer 6 are formed and patterned to form trench 8, as has been previously discussed. As a design consideration, thermal budget should be kept in mind when forming oxide 4, nitride 6, and in subsequent process steps. This is because exceeding a thermal budget may result in degradation of the desirable properties of SiGe layer 5 including, in some cases, a relaxation of the stress developed between SiGe layer 5 and Si fin 20 (discussed below with reference to FIG. 2c). Process temperatures not exceeding range from about 700 C to about 800 C are preferable for maintaining a satisfactory thermal budget. In this embodiment, the substrate exposed at the bottom of trench 8 is SiGe layer 5. For simplicity of illustration, silicon wafer 1 is not illustrated in FIG. 2b and the remaining figures.

Figure 2C:
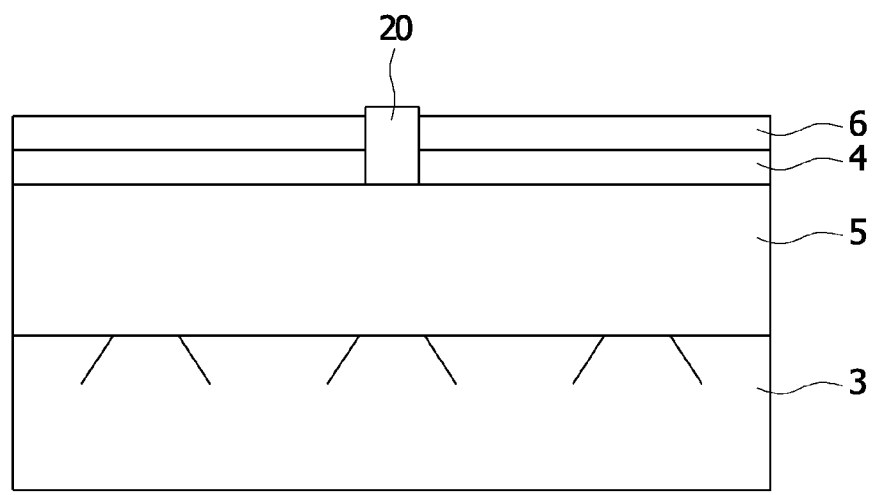

Continuing on to FIG. 2c, fin 20 is epitaxially grown on the exposed surface of SiGe layer 3 at the bottom of trench 8, filling trench 8. In this embodiment, wherein the underlying substrate (layer 3) is SiGe, fin 20 comprises Si. In this way, a lattice mismatch is again created at the interface between silicon fin 20 and underlying SiGe substrate 3. Because SiGe has a larger lattice constant than Si, a biaxial tensile strain is imposed on Si fin 20. Tensile strain tends to improve the electron carrier mobility of n-type transistors, so this embodiment is particularly well suited for n-type fin-FETs.

Figure 2D:
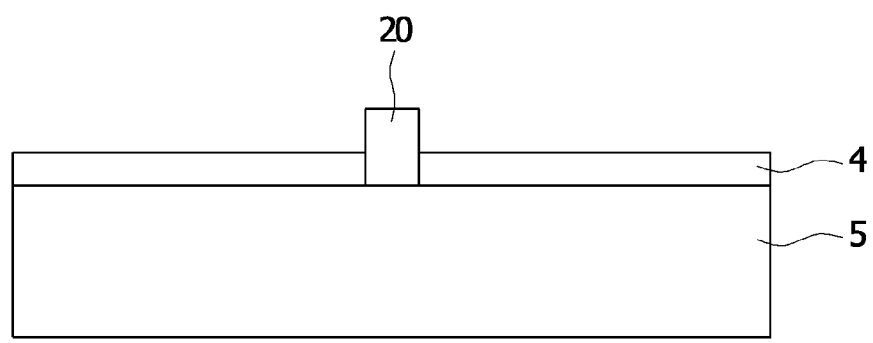
Figure 2E:
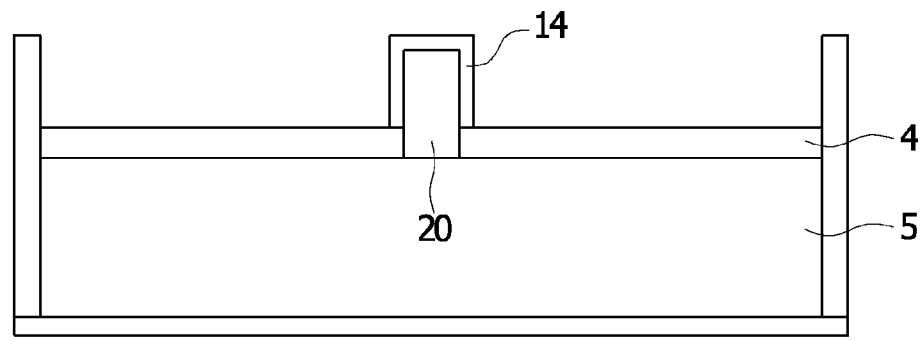

As illustrated in FIG. 2d, processing continues with the removal of nitride layer 6, similar to the process discussed above with reference to FIG. 1c. For simplicity of illustration, buffer layer 3 is not shown in FIG. 2d or the following figures. In this embodiment, there is no need for a sacrificial Si cap layer to be formed on Si fin 20. Rather, and as shown in FIG. 2e, gate dielectric 14 can be formed directly on Si fin 20, such as by thermally growing gate dielectric 14 on the exposed surfaces of fin 20. One skilled in the art will recognize that some part of Si fin 20 will be consumed in the process of growing gate dielectric 14. This can be compensated for by nominally designing fin 20 height and thickness to accommodate the loss due to formation of gate dielectric 14.

Figure 2F:
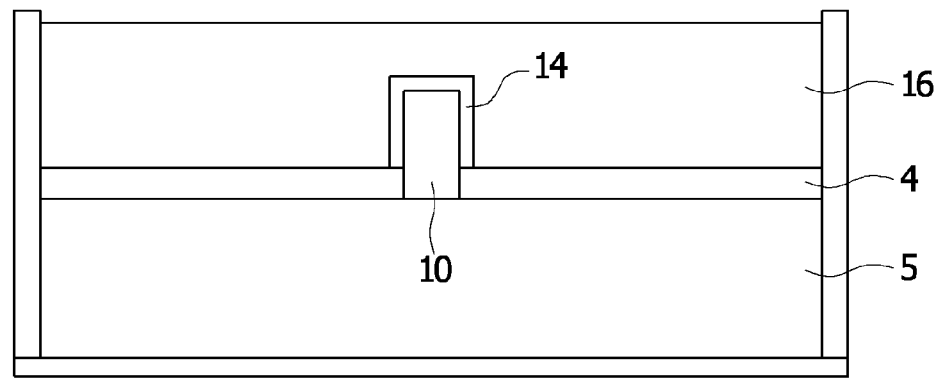

Finally, and as shown in FIG. 2f, gate electrode 16 is formed atop gate dielectric 14 and the surrounding oxide layer 4. As explained above with reference to FIG. 1e, gate conductor 16 may comprise polysilicon, or alternatively may comprise a metal, metal alloy, or conductive metal nitride or metal oxide. Likewise and as also explained above with reference to the embodiment illustrated in FIG. 1e, gate dielectric may alternatively be formed of a high-k dielectric such as HfO$_2$, HfSiO, or other well-known alternatives.

Figure 3A:
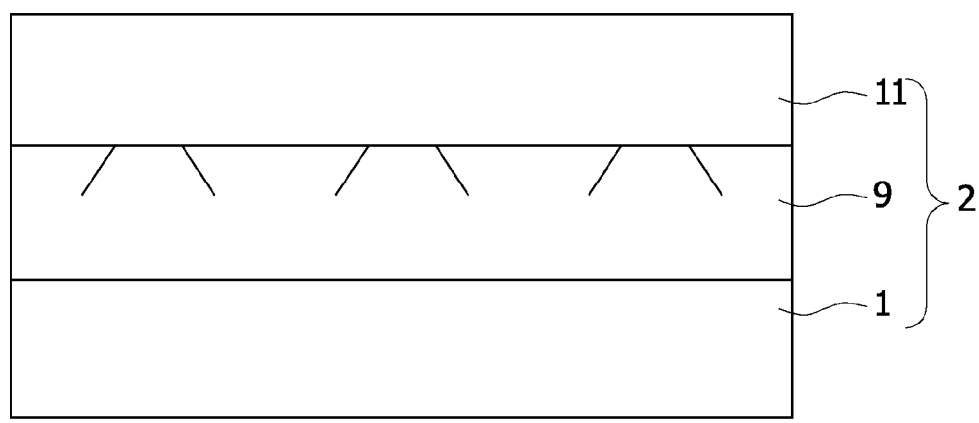
FIGS. 3a through 3f illustrate steps in the manufacture of a third illustrative embodiment multi-channel transistor of the present invention.

Yet another illustrative embodiment is illustrated in FIGS. 3a through 3f. In this embodiment, as shown in FIG. 3a, substrate 2 comprises a silicon wafer 1, a buffer layer 9, and a relaxed SiC layer 11. In this case, buffer layer 9 has a carbon concentration that varies from near nil at the bottom (at the interface with silicon wafer 1) to a concentration equivalent to that contained in relaxed SiC layer 11 (at the interface with that layer).

Figure 3B:
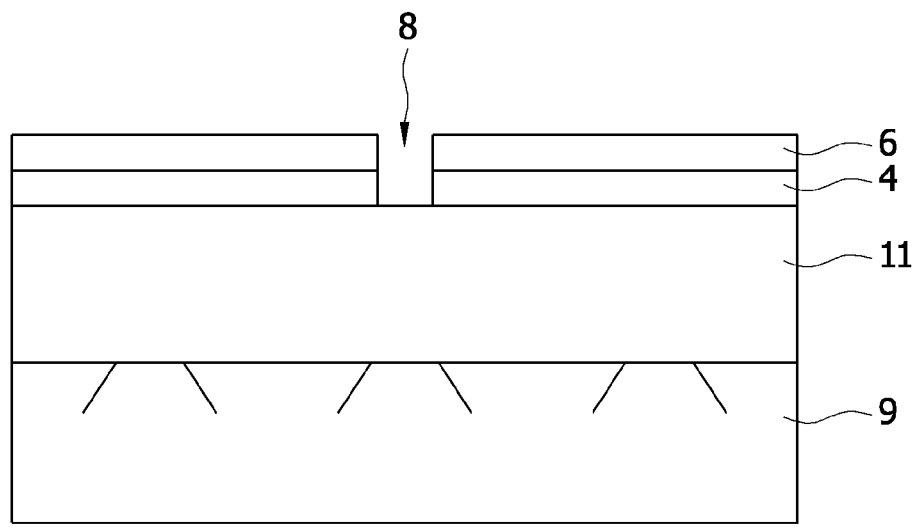
Figure 3C:
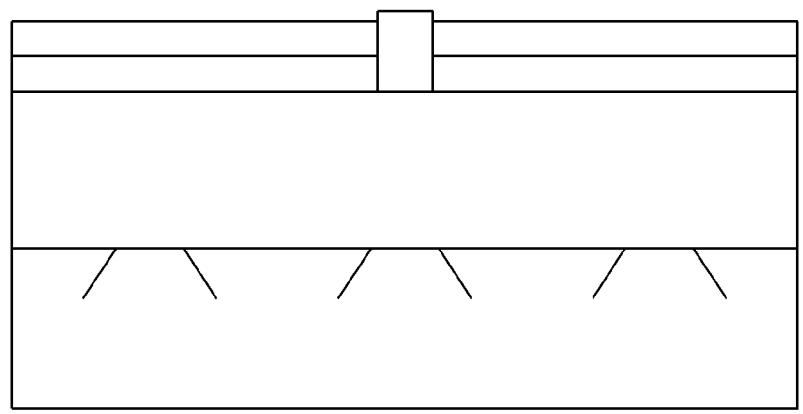

As shown in FIG. 3b, oxide layer 4 and nitride layer 6 are formed over SiC layer 11, using processes such as described above. Next, oxide layer 4 and nitride layer 6 are patterned, also such as described above, to form trench 8. In this embodiment, trench 8 exposes underlying SiC layer 11. As shown in FIG. 3c, trench 8 is filled with epitaxially grown silicon, much as described above with reference to FIG. 2c, to form fin 20. In this embodiment, Si fin 20 is grown upon underlying SiC layer 11. As is known, SiC has a lesser lattice constant than does silicon. This means that a biaxial compressive stress arises at the interface of SiC layer 11 and Si film 20, resulting in a compressive strain in fin 20. This compressive strain enhances hole mobility and, hence, is particularly beneficial when forming p-type MOSFETs.

Figure 3D:
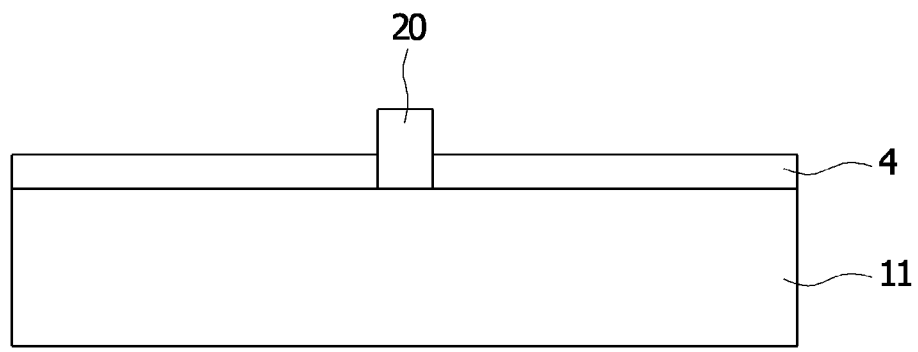
Figure 3E:
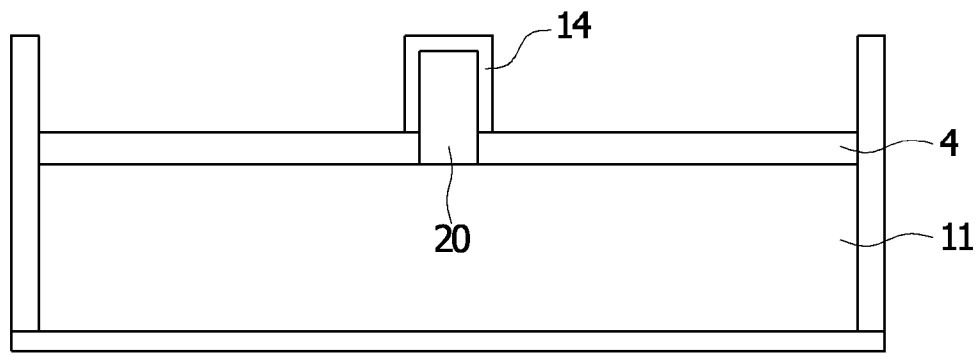
Figure 3F:
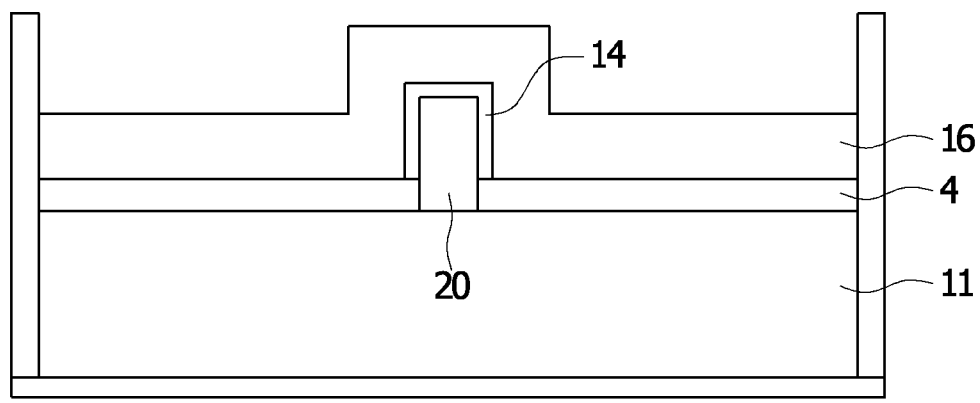

Continuing on to FIG. 3d, nitride layer 6 is removed, exposing Si fin 20 and underlying oxide layer 4. Next, Si fin 20 is exposed to an oxidizing environment, wherein a portion of the top surface and exposed sidewalls of Si fin 20 are converted to silicon oxide. This process forms gate dielectric 14, as illustrated in FIG. 3e. Polysilicon gate electrode 16 is deposited over gate dielectric 14, as shown in FIG. 3f. As in the prior described embodiments, gate dielectric 14 may alternatively be a high-k dielectric and gate electrode 16 may alternatively comprise a metal, metal alloy, metal nitride, or metal oxide.

Figure 7:
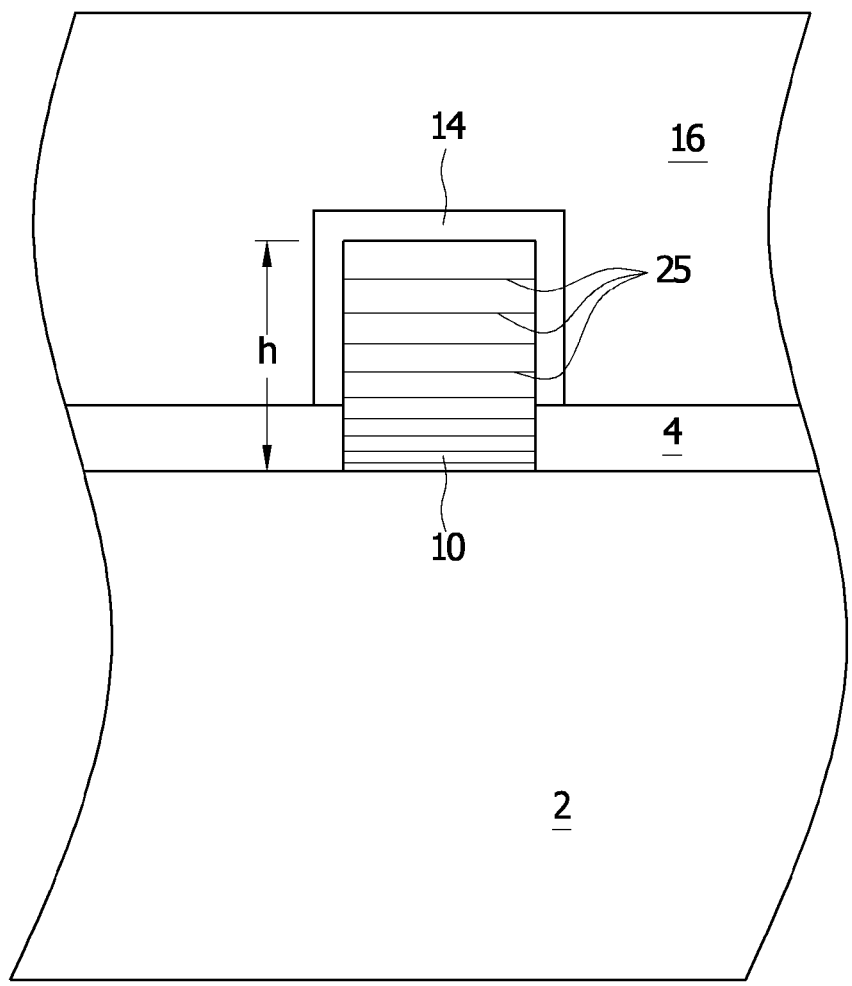
FIG. 7 schematically illustrates the distribution of strain across an illustrative transistor fin structure.

Employing the materials and processes described above, it is envisioned that localized strain in the range of up to 500 MPa to 1,000 MPa is achievable. As a potential design constraint, however, it should be recognized that the strain imposed on fin 10, 20 is greatest at the interface with underlying layer 2, 5, or 11. The further from the interface, the lesser the imposed strain. The phenomenon is illustrated schematically in FIG. 7, which illustrates a highly magnified view of a portion of FIG. 1e. Fin 10 is shown, and superimposed on fin 10 are strain lines 25. These strain lines schematically illustrate the relative magnitude of strain imposed on fin 10. Areas where the strain lines are highly dense (closely spaced) illustrate areas of high strain, whereas areas where the strain lines are less dense (spaced apart) illustrate areas of relatively lower strain. As schematically illustrated, the strain imposed on fin 10 (and analogously on fin 20 in the other embodiments), is the highest at the interface with the underlying layer and steadily decreases as the distance from the interface increases. This phenomenon imposes a practical limit on the height h of fin 10 (and analogously fin 20) of no more than perhaps 500 Å to 1,000 Å, using presently available processes and materials. This is a practical limitation on present embodiments, but should not be considered as a limitation on the application or teaching of the present invention—it being envisioned that the current invention will be applicable to future developed materials and processes.

Various other combinations of materials can be employed in forming the substrate and fin. Depending upon the desired strain in the fin, one can employ a substrate/fin combination of Si/SiGe, SiGe/Si, SiC/Si, Si/SiC, or other combinations. The combinations are not limited to the above-described materials. In fact, any Group III, Group IV, or Group V element that can be introduced into the silicon lattice and change the lattice constant could be employed. Design constraints such as cost, ease of manufacturing, potential contamination concerns, and the like, are the only limitations.

In the illustrated embodiments, only a single fin 10, 20 is shown. One skilled in the art will recognize that millions of fins are likely to be formed on a single wafer and, in fact, in a single integrated circuit. As was discussed above, certain fin/substrate combinations produce compressive strain and, hence, are particularly advantageous for improving carrier mobility in p-type devices, whereas other fin/substrate combinations produce tensile strain in the fin and, hence, are particularly advantageous to improve carrier mobility in n-type devices. It may be advantageous, therefore, to employ different fin structures in a single integrated circuit for the different transistor types (n-type, p-type), particularly when employing so-called CMOS technology.

Figure 4A:
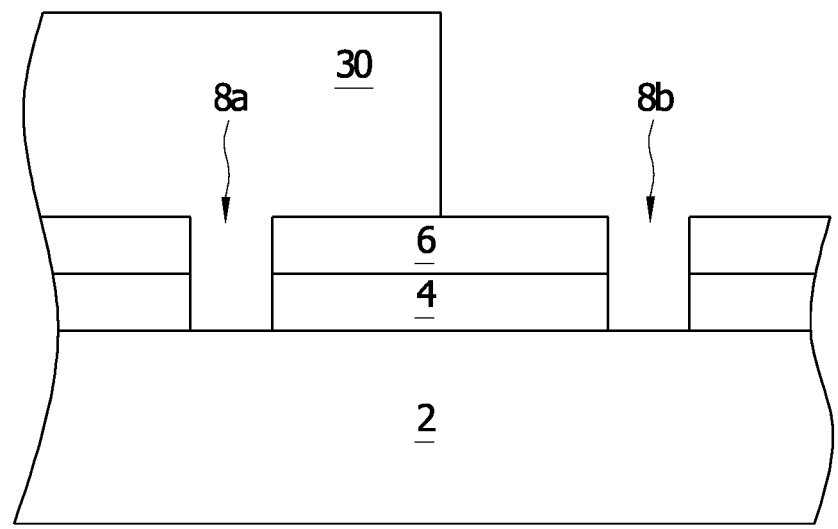
FIGS. 4a through 4e illustrate steps in a first illustrative manufacturing process for an integrated circuit including embodiments of the present invention.
Figure 4B:
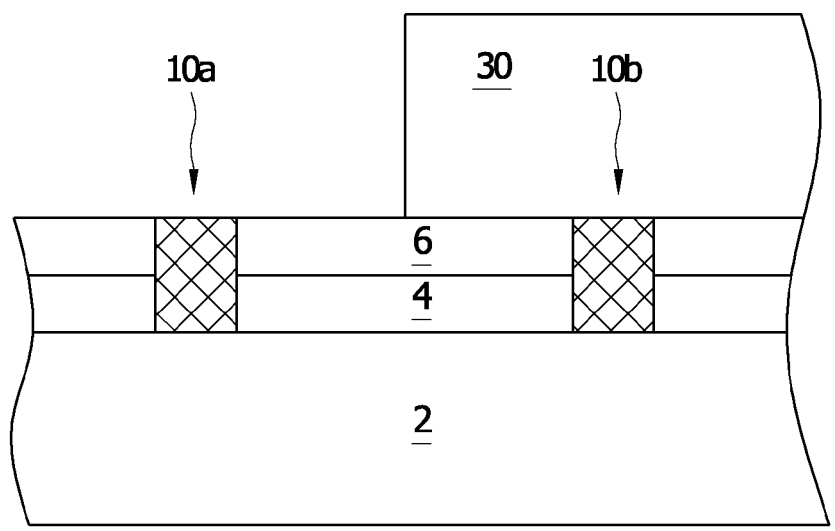

One approach to accommodating CMOS devices is shown in FIGS. 4a through 4e. FIG. 4a illustrates substrate 2 upon which oxide 4 and nitride 6 have been formed. Trenches 8a and 8b have been formed, as described above. For simplicity of illustration, only two such trenches are shown. Also not shown, are the various well regions, isolation structures, noise isolation rings, and other features commonly formed in substrate 2. Photoresist material 30 has been formed and patterned, leaving first trench 8a covered and second trench 8b exposed. Silicon germanium is then epitaxially grown on the exposed surface of Si substrate 2 at the bottom of trench 8b, filling trench 8b to form SiGe fin 10b, as shown in FIG. 4b. Optionally, fin 10b can be implanted with n-type impurities at this point to form source and drain regions (not shown). No extra mask step is required, as fin 10a has not yet been formed, and trench 8a is covered by photoresist 30.

Figure 4C:
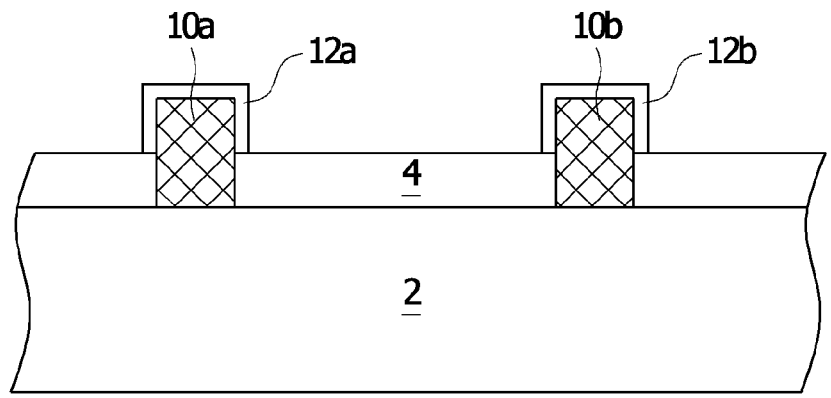

Also shown in FIG. 4b, photoresist 30 is stripped off, re-applied, and re-patterned such that fin 10b is covered and trench 8a is exposed. Then, silicon carbide is epitaxially grown in trench 8a on the exposed surface of underlying substrate 2, filling trench 8a to form fin 10a. Fin 10a can then be implanted with appropriate p-type impurities to form source and drain regions. This is preferably done while fin 10b is protected by photoresist 30, although the relative doping concentrations could alternatively be adjusted such that fin 10b is heavily enough doped with n-type impurities so that source/drain regions of fin 10b remain n-type, even after p-type counter doping. Photoresist 30 is then stripped off, followed by removal of nitride layer 6 and the formation of silicon cap layers 12a and 12b, as shown in FIG. 4c.

Figure 4D:
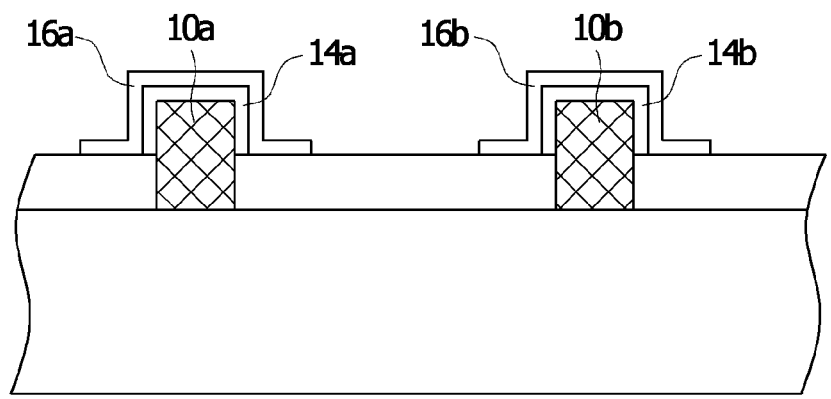

The device is then exposed to an oxidizing environment to convert silicon cap layers 12a, 12b to gate oxides 14a, 14b, respectively, as shown in FIG. 4d. Next gate electrodes 16a and 16b are formed and patterned. In the illustrated embodiment, a substrate had grown thereon both SiC fins and SiGe fins to achieve the desired strained fin. Alternatively, a SiC or SiGe virtual substrate could have grown thereon Si or other material fins for strain engineering. The respective materials chosen are a matter of design choice and routine experimentation.

Figure 4E:
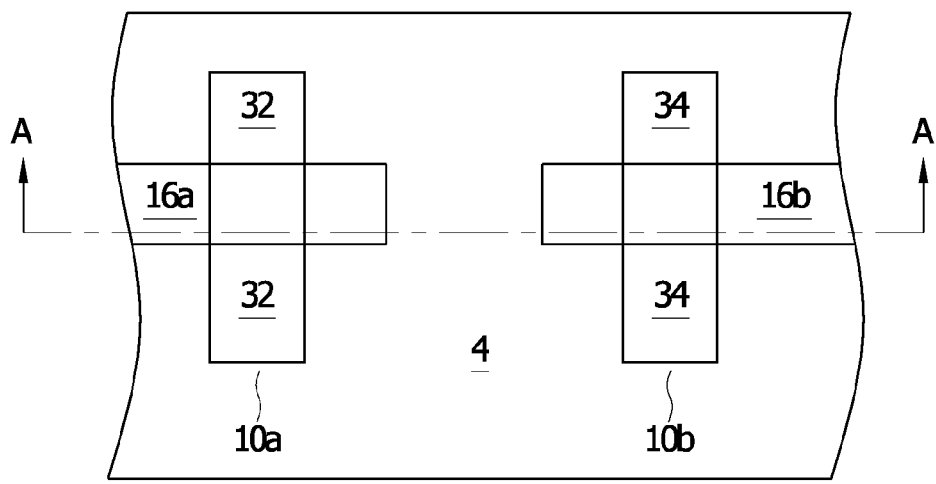

FIG. 4e schematically illustrates in plan view the structure shown in cross-sectional view in FIG. 4d. A p-type fin-FET is provided by fin 10a, which has n-type source/drain regions 32 implanted at its respective ends. A channel region is defined between source and drain regions 32 and gate electrode 16a overlies the channel region (along the top surface of fin 10b as well as along the sidewalls of fin 10b). Likewise, an n-type fin-FET is provided by fin 10b, which has p-type source/drain regions 34 formed at either end and a channel region defined therebetween. Gate electrode 16b overlies the channel region (along the top surface of fin 10b as well as along the sidewalls of fin 10b). For point of reference, FIGS. 1, 2, 3, and 4a-4d illustrate the cross-section indicated at line A-A in FIG. 4e.

Figure 5A:
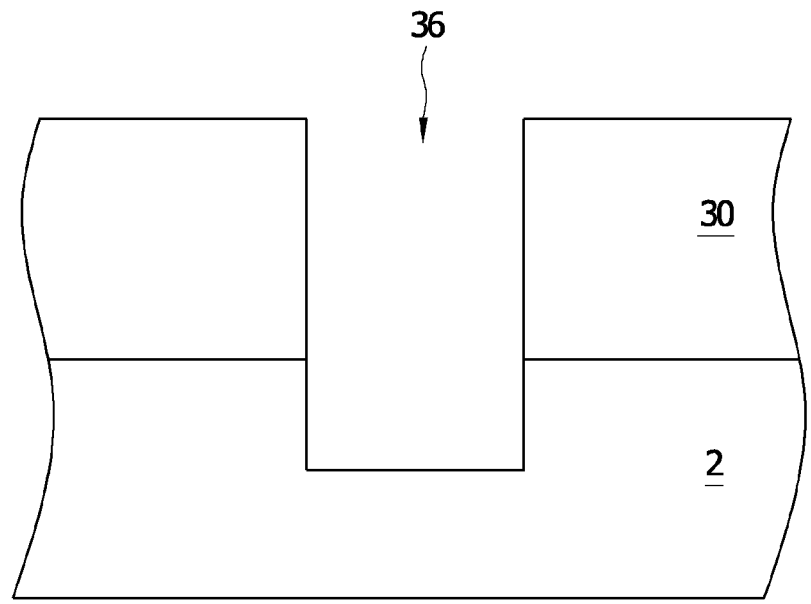
FIGS. 5a through 5e illustrate steps in a first illustrative manufacturing process for an integrated circuit including embodiments of the present invention.
Figure 5B:
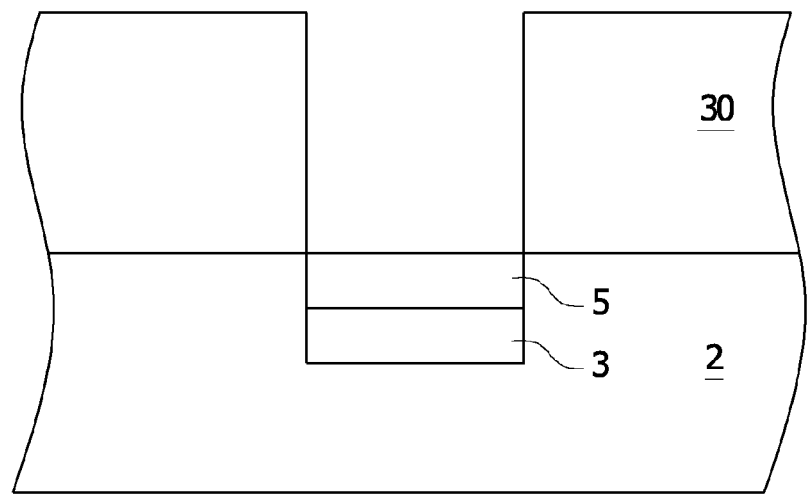

Yet another approach to CMOS integration of a strained-fin p-type fin-FET and a strained-fin n-type fin-FET is shown in FIGS. 5a through 5e, which illustrate a so-called split wafer approach. FIG. 5a illustrates a silicon wafer 2 in which a deep trench 36 has been formed by anisotropic etching or a combination of isotropic and anisotropic etching. Photoresist material 30 is employed to define the position and size of the deep trench. Buffer layer 3 and SiGe layer 5 are epitaxially and selectively grown on the exposed silicon surfaces of deep trench 36. During the epitaxial growth of buffer layer 3, germanium is gradually introduced as a precursor so as to gradually increase the germanium concentration of the buffer layer from effectively nil to the nominal concentration in SiGe layer 5. Epitaxial growth continues with the nominal SiGe concentration, resulting in SiGe layer 5. As will be apparent to one skilled in the art, buffer layer 3 and SiGe layer 5 are illustrated as distinct layers. In practice, however, the interface between these layers may be indistinct or entirely indistinguishable.

Figure 5C:
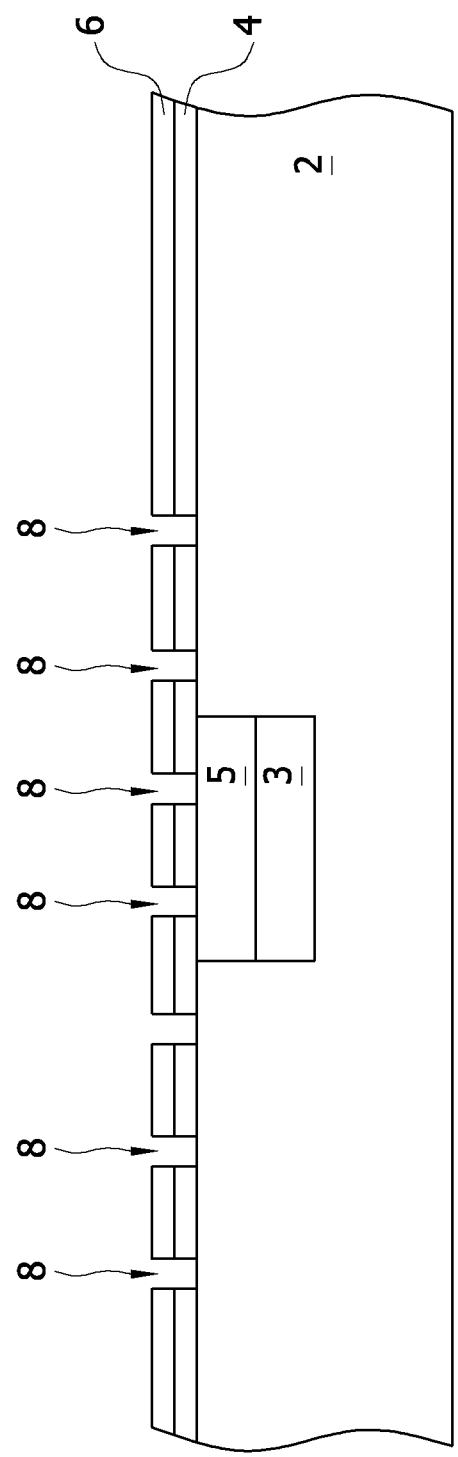

FIG. 5c illustrates the formation and patterning of oxide layer 4 over substrate 2, and SiGe layer 5, and nitride layer 6 over oxide layer 4, to form trenches 8. Note that certain trenches expose substrate 2 and other trenches expose SiGe layer 5.

Figure 5D:
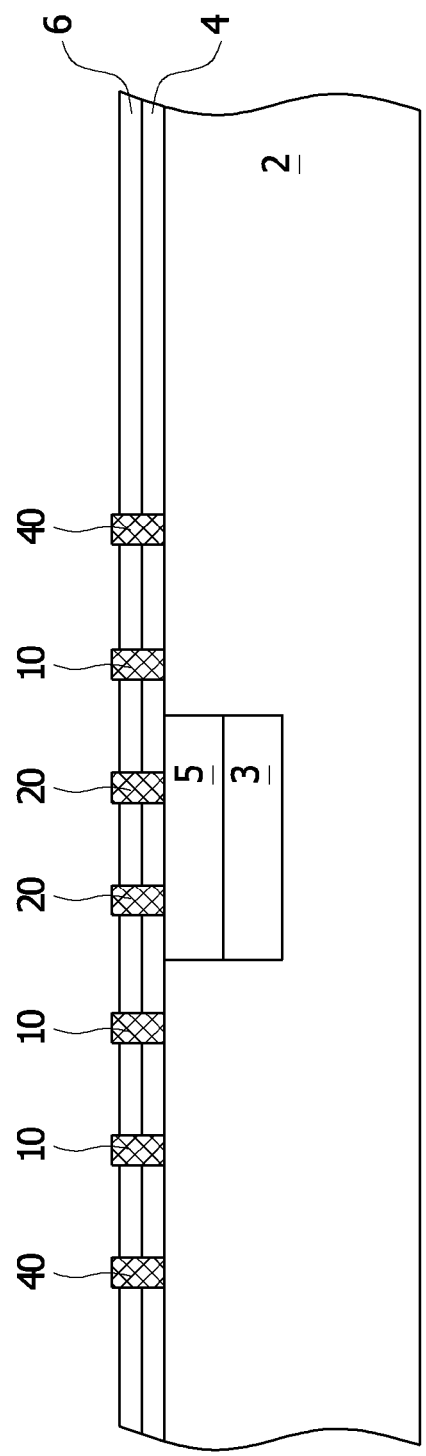

Through appropriate masking and epitaxial growth steps, fins of varying composition can be grown in the respective trenches 8. For instance, as shown in FIG. 5d, SiGe fins 10 may be grown over substrate 2, whereas Si fins 20 may be grown over SiGe layer 5. One skilled in the art will recognize that this can be accomplished by masking certain trenches 8, while growing SiGe in the exposed trenches, followed by exposing the previously masked trenches 8, masking the SiGe fins, and growing Si in the exposed trenches. Also shown in FIG. 5d, by way of illustration, are exemplary SiC fins 40. These fins likewise are grown in trenches that are masked when the other fins are formed, and likewise the other fins are masked while SiC is epitaxially grown in the appropriate trenches. Obviously, the placement and arrangement of fins 10, 20, and 40 in FIG. 5d is for illustration only. Likewise, the relative size and placement of buffer layer 3/SiGe layer 5, relative to Si substrate 2 is for illustration only. In practice, numerous trenches of different sizes and configurations would likely be used. Also, while a SiGe virtual substrate formed in a silicon wafer is illustrated, various other materials for the wafer and the virtual substrate will be apparent to one skilled in the art.

Figure 5E:
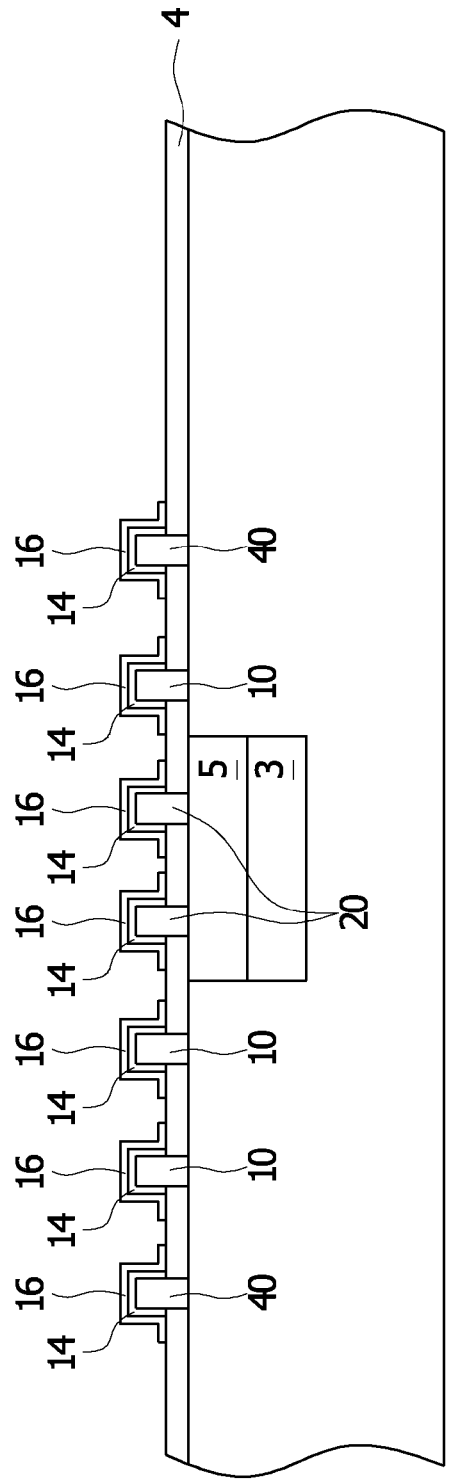

For completeness, FIG. 5e illustrates the integrated circuit of FIG. 5d with nitride layer 6 removed and after the formation of respective gate dielectrics 14 and gate electrodes 16, using the processes discussed above with reference to FIGS. 1 through 4.

Figure 6:
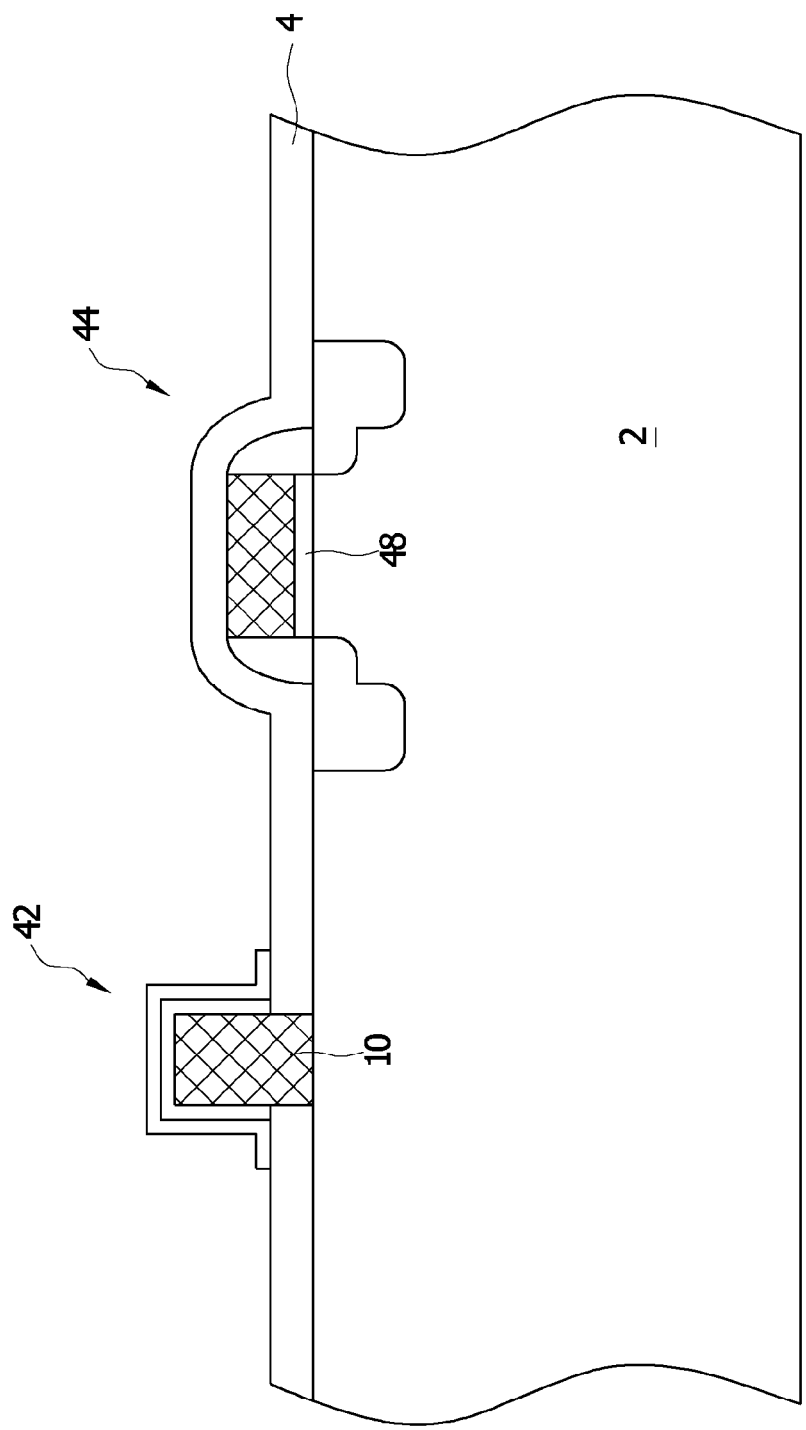
FIG. 6 illustrates an illustrative integrated circuit including a multi-gate transistor embodying aspects of the invention and a planar transistor.

In yet another illustrative embodiment, a single integrated circuit employs both body-tied, strained-fin fin-FET devices and planar transistors. As illustrated in FIG. 6, the manufacturing processes for a body-tied, strained-channel multichannel transistor of the illustrative embodiments is fully compatible with conventional planar transistor CMOS process flows. In one integration scheme, oxide layer 4, which is used in the fabrication of exemplary multi-gate transistor 42, can be employed as an oxide liner layer for a planar transistor device 44, or alternatively as at least a portion of an ILD layer for the transistor device 44. In another embodiment (not shown), oxide layer 4 could serve as the gate oxide for planar device 48. Again numerous features and elements necessary for an actual device are omitted from FIG. 6 in order to clarify features of the embodiment.

Advantageous embodiments of the invention include a method of manufacturing a transistor. The method includes providing a substrate having a top surface, the top surface having a first lattice constant, forming an insulating layer over said top surface, forming an opening in said insulating layer to expose a portion of said top surface, and epitaxially growing an extension on said top surface in said opening, the extension having a second lattice constant that is different from said first lattice constant. The method further includes forming a doped region in said extension, forming a gate dielectric over at least a portion of said extension, and forming a gate electrode over said gate dielectric. In some embodiments, providing a substrate includes providing a wafer; forming a buffer layer on said wafer, and forming a semiconductor layer on said buffer layer, the semiconductor layer having said first lattice constant. Forming an insulating layer could include forming an oxide layer on said top surface and forming a nitride layer on the oxide layer. Forming a doped region in the extension could include ion implanting impurities to form a first source/drain region and a second source/drain region. Forming a gate dielectric could include oxidizing a portion of said extension. In some embodiments, forming a gate dielectric includes forming a semiconductor layer on a portion of said extension, and oxidizing said semiconductor layer on a portion of said extension.

In some aspects, embodiments described herein provide for a method comprising epitaxially growing on a substrate having a first lattice constant, a fin having a second lattice constant, different than the first lattice constant and epitaxially growing a cap layer on the fin, the cap layer having the first lattice constant.

In other aspects, embodiments described herein provide for a method comprising: epitaxially growing on a substrate having a first lattice constant a fin having a second lattice constant, different than the first lattice constant, the fin having a continuous crystalline structure with the substrate and epitaxially growing a cap layer on the fin, the cap layer having a lattice constant different from the second lattice constant.

In yet other aspects, embodiments described herein provide for a method forming on a substrate having a first lattice constant a first fin having a second lattice constant, the second lattice constant being different than the first lattice constant, the first fin having a continuous crystalline structure with the substrate, and forming on the substrate a second fin having a third lattice constant, the third lattice constant being different than the first lattice constant and the second lattice constant, the second fin having a continuous crystalline structure with the substrate.

Another advantageous feature of some embodiments may include a device comprising a silicon containing substrate having a first lattice constant and having a top and a member protruding from the top of the substrate and having a second lattice constant, different than the first lattice constant. The member has a continuous crystalline structure with the silicon containing substrate. The device further includes an insulating material formed atop said top surface of said member, and a conducting material formed atop said insulating material. In some embodiments, a difference between the first and second lattice constants creates a bi-axial compressive strain in the member. In some embodiments, the bi-axial compressive strain originates at an interface between the top of the substrate and a bottom of the member. The device may further include a second member protruding from said top of said substrate and having a third lattice constant, different than the first and second lattice constant, the second member having a continuous crystalline structure with the silicon containing substrate. In some embodiments, the device includes comprising a trench in said substrate, a buffer layer formed in the trench, and a relaxed layer formed on the buffer layer. In other embodiments, the member comprises Si and the second member comprises SiGe or SiC.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   epitaxially growing on a substrate having a first lattice constant, a fin having a second lattice constant, different than the first lattice constant; and
   epitaxially growing a cap layer on the fin, the cap layer having the first lattice constant.

2. The method of claim 1, further comprising converting the cap layer to an oxide layer.

3. The method of claim 2, wherein the step of converting the cap layer to an oxide layer includes exposing the cap layer to a steam environment.

4. The method of claim 2, further comprising forming a gate electrode layer on the oxide layer.

5. The method of claim 1, further comprising:
   forming an oxide layer on the substrate;
   forming a nitride layer on the oxide layer;
   patterning the nitride layer and the oxide layer to form a trench, the trench exposing a portion of the substrate; and
   growing the fin in the trench.

6. The method of claim 1, wherein the substrate comprises silicon and the fin comprises SiGe.

7. The method of claim 1, wherein the substrate comprises SiGe and the fin comprises Si.

8. The method of claim 1, further comprising forming on the substrate regions having the second lattice constant and epitaxially growing on the regions fins having the first lattice constant.

9. The method of claim 8, wherein the step of forming on the substrate regions having the second lattice constant comprises forming a trench in the substrate, filling a lower portion of the trench with a buffer layer, filling an upper portion of the trench with a relaxed layer having the first lattice constant.

10. A method comprising:
   epitaxially growing on a substrate having a first lattice constant a fin having a second lattice constant, different than the first lattice constant, the fin having a continuous crystalline structure with the substrate; and
   epitaxially growing a cap layer on the fin, the cap layer having a lattice constant different from the second lattice constant.

11. The method of claim 10, wherein the step of epitaxially growing on a substrate a fin having a first lattice constant includes epitaxially growing a SiGe fin on a Si substrate.

12. The method of claim 10, wherein the cap layer has the first lattice constant.

13. The method of claim 10, further comprising converting the cap layer to an oxide layer.

14. The method of claim 10 further comprising forming region in the substrate having the second lattice constant and growing on the regions second fins having the first lattice constant.

15. The method of claim 10, further comprising forming a high dielectric constant gate insulator over portions of the fin.

16. A method comprising:
   forming on a substrate having a first lattice constant a first fin having a second lattice constant, the second lattice constant being different than the first lattice constant, the first fin having a continuous crystalline structure with the substrate; and
   forming on the substrate a second fin having a third lattice constant, the third lattice constant being different than the first lattice constant and the second lattice constant, the second fin having a continuous crystalline structure with the substrate.

17. The method of claim 16, further comprising forming on the first fin and the second fin a cap layer having the first lattice constant.

18. The method of claim 17, further comprising converting the cap layer to an insulating layer.

19. The method of claim 16, wherein the substrate is Si, the first fin comprises SiGe, and the second fin comprises SiC.

20. The method of claim 16, further comprising forming a high k dielectric constant gate oxide material over a portion of the first fin and the second fin.

* * * * *